United States Patent
Han et al.

(10) Patent No.: US 12,245,463 B2
(45) Date of Patent: Mar. 4, 2025

(54) DISPLAY PANEL AND DISPLAY DEVICE HAVING DETECTION CIRCUIT AND LIGHT-EMITTING DEVICE

(71) Applicant: BOE Technology Group Co., Ltd., Beijing (CN)

(72) Inventors: Ying Han, Beijing (CN); Ling Wang, Beijing (CN); Yicheng Lin, Beijing (CN); Pan Xu, Beijing (CN); Guoying Wang, Beijing (CN); Xing Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 452 days.

(21) Appl. No.: 17/637,772

(22) PCT Filed: Feb. 2, 2021

(86) PCT No.: PCT/CN2021/074948
§ 371 (c)(1),
(2) Date: Feb. 23, 2022

(87) PCT Pub. No.: WO2021/190163
PCT Pub. Date: Sep. 30, 2021

(65) Prior Publication Data
US 2022/0320217 A1     Oct. 6, 2022

(30) Foreign Application Priority Data

Mar. 27, 2020   (CN) .......................... 202010227328.2

(51) Int. Cl.
*H10K 59/121*      (2023.01)
*H10K 59/126*      (2023.01)
(Continued)

(52) U.S. Cl.
CPC ....... *H10K 59/1213* (2023.02); *H10K 59/126* (2023.02); *H10K 59/131* (2023.02); *H10K 59/60* (2023.02)

(58) Field of Classification Search
CPC ............ H10K 59/1213; H10K 59/126; H10K 59/131; H10K 59/60; H10K 59/00; H10K 59/12
(Continued)

(56) References Cited

U.S. PATENT DOCUMENTS

| 2006/0063298 A1* | 3/2006 | Winters ............... G09G 3/3241 |
| | | 257/E27.111 |
| 2009/0009673 A1* | 1/2009 | Hisada .................. G02F 1/1362 |
| | | 257/E27.113 |

(Continued)

FOREIGN PATENT DOCUMENTS

| CN | 105243361 A | 1/2016 |
| CN | 109147660 A | 1/2019 |

(Continued)

*Primary Examiner* — Duy T Nguyen
(74) *Attorney, Agent, or Firm* — Workman Nydegger

(57) ABSTRACT

Disclosed are a display panel and a display device. The display panel includes: a base substrate; a detection circuit, located on the side of the base substrate, and including a transistor and a photosensitive detection component electrically connected to the transistor, and an orthographic projection of the transistor on the base substrate and an orthographic projection of the photosensitive detection component on the base substrate do not overlap with each other; a planarization layer, located on the side of the detection circuit facing away from the base substrate, and including a first surface facing away from the base substrate at the position in which the transistor is located, and a second surface facing away from the base substrate at the position in which the photosensitive detection component is located;

(Continued)

and a light-emitting device, located on the side of the planarization layer away from the detection circuit.

19 Claims, 6 Drawing Sheets

(51) Int. Cl.
  *H10K 59/131* (2023.01)
  *H10K 59/60* (2023.01)
(58) Field of Classification Search
  USPC .......................................................... 257/40
  See application file for complete search history.

(56) References Cited

U.S. PATENT DOCUMENTS

| | | | | |
|---|---|---|---|---|
| 2016/0103649 | A1* | 4/2016 | Yoshitani | H10K 59/18 |
| | | | | 345/694 |
| 2017/0032167 | A1* | 2/2017 | Chen | H01L 21/0274 |
| 2018/0175268 | A1* | 6/2018 | Moon | H01L 27/15 |
| 2018/0226462 | A1* | 8/2018 | Zhou | H01L 29/7869 |
| 2020/0264715 | A1* | 8/2020 | Eom | H10K 77/10 |
| 2020/0313111 | A1* | 10/2020 | Kim | H10K 50/84 |
| 2021/0124897 | A1 | 4/2021 | Liu et al. | |

FOREIGN PATENT DOCUMENTS

| | | |
|---|---|---|
| CN | 110047906 A | 7/2019 |
| CN | 110164847 A | 8/2019 |
| CN | 111403455 A | 7/2020 |

\* cited by examiner

DISPLAY PANEL AND DISPLAY DEVICE HAVING DETECTION CIRCUIT AND LIGHT-EMITTING DEVICE

CROSS REFERENCE TO RELATED APPLICATIONS

This application is a National Stage of International Application No. PCT/CN2021/074948, filed on Feb. 2, 2021, which claims priority to Chinese Patent Application No. 202010227328.2, filed with the China National Intellectual Property Administration on Mar. 27, 2020 and entitled "Display Panel and Display Device", both of which are hereby incorporated by reference in their entireties.

FIELD

The disclosure relates to the field of display technology, and particularly to a display panel and a display device.

BACKGROUND

The Organic Light-Emitting Diode (OLED) display is a research focus in the display technology. Compared with the liquid crystal display device, the OLED display device has many advantages, such as low power consumption, low manufacturing cost, self-luminescence, wider viewing angle, and faster response. Therefore, the OLED displays are widely used in mobile phones, Personal Digital Assistants (PDAs), digital cameras, televisions, tablet computers, and portable computers.

Currently, it is generally necessary to perform optical compensation on the display panel; while the currently developed optical compensation backplane is a backplane to which a photosensitive device and a corresponding detection circuit are added, and can monitor changes in EL efficiency to thereby compensate for display inconsistency.

SUMMARY

An embodiment of the disclosure provides a display panel, including: a base substrate; a detection circuit, located on a side of the base substrate, and including a transistor and a photosensitive detection component electrically connected to the transistor, where an orthographic projection of the transistor on the base substrate and an orthographic projection of the photosensitive detection component on the base substrate do not overlap with each other; a planarization layer, located on a side of the detection circuit facing away from the base substrate, and including: a first surface facing away from the base substrate at a position where the transistor is located, and a second surface facing away from the base substrate at a position where the photosensitive detection component is located, where the first surface and the second surface are located on a same plane; a light-emitting device, located on a side of the planarization layer facing away from the detection circuit; a pixel circuit, electrically connected to the light-emitting device, where an orthographic projection of the pixel circuit on the base substrate, an orthographic projection of the light-emitting device on the base substrate, and an orthographic projection of the detection circuit on the base substrate do not overlap with each other.

In a possible embodiment, at least two light-emitting devices share one photosensitive detection component, and each of the light-emitting devices sharing the same photosensitive detection component has an overlapping area with the photosensitive detection component; at least two photosensitive detection components are electrically connected to a same transistor.

In a possible embodiment, every four light-emitting devices share one photosensitive detection component, the four light-emitting devices are located in two adjacent rows and two adjacent columns, and the photosensitive detection component is located at a center of a quadrangle formed by centers of the four light-emitting devices.

In a possible embodiment, every two photosensitive detection components are connected to one transistor, and the transistor is located between two adjacent photosensitive detection components between two adjacent rows of light-emitting devices.

In a possible embodiment, the photosensitive detection component includes: a first detection electrode, a photosensitive film layer located on a side of the first detection electrode facing away from the base substrate, and a second detection electrode located on a side of the photosensitive film layer facing away from the first detection electrode; the transistor includes a source and drain layer located on a side of the base substrate, and the first detection electrode is located in the source and drain layer.

In a possible embodiment, the transistor includes: a gate layer located between the base substrate and the source and drain layer, and an interlayer dielectric layer located between the gate layer and the source and drain layer; the gate layer includes: a first gate line located between two adjacent rows of light-emitting devices and extending in a first direction, and a first bridging electrode located between two adjacent rows of light-emitting devices, where an orthographic projection of the first bridging electrode on the base substrate has an overlap area with each of first detection electrodes of the two photosensitive detection components sharing the same transistor; two of the first detection electrodes are electrically connected to the same first bridging electrode through first-type via holes penetrating the interlayer dielectric layer, and electrically connected to a source electrode in the source and drain layer of the transistor through a second-type via hole penetrating the interlayer dielectric layer through the first bridging electrode.

In a possible embodiment, the source and drain layer further includes: a first light detection signal line located between two adjacent photosensitive detection components and extending perpendicular to the first direction, where the first light detection signal line is multiplexed as a drain electrode of the transistor.

In a possible embodiment, the first bridging electrode includes: a first main branch extending in the first direction, and two first branches that are connected to two ends of the first main branch respectively and extend perpendicular to the first direction and towards a side facing away from the first gate line; the first bridging electrode is electrically connected to the first detection electrode through the first-type via holes at the first branches, and electrically connected to the source electrode through the second-type via hole at middle of the first main branch.

In a possible embodiment, the gate layer further includes: a second light detection signal line having a same extension direction as the first gate line and located on a side of the first gate line facing away from the first bridging electrode.

In a possible embodiment, the source and drain layer further includes: a transition electrode; the light-emitting device includes: a pixel electrode layer, the pixel electrode layer including: a pixel electrode and a second bridging electrode; the display panel further includes: a passivation layer located between the second detection electrode and the planarization layer, where the passivation layer contacts and covers the source and drain layer of the transistor, and contacts and covers the second detection electrode of the photosensitive detection component; an orthographic projection of the second bridging electrode on the base substrate has an overlap area with each of second detection electrodes of the two photosensitive detection components sharing the same transistor; and two of the second detection electrodes are electrically connected to the same second bridging electrode through third-type via holes penetrating the planarization layer and the passivation layer, electrically connected to the transition electrode through a fourth-type via hole penetrating the planarization layer and the passivation layer through the second bridging electrode, and electrically connected to the second light detection signal line through a fifth-type via hole penetrating the interlayer dielectric layer through the transition electrode.

In a possible embodiment, the second bridging electrode includes a second main branch extending in the first direction and a second branch extending perpendicular to the first direction from a middle portion of the second main branch, where: in a direction perpendicular to the base substrate, an orthographic projection of the second main branch is located between an orthographic projection of the first gate line and an orthographic projection of the second light detection signal line, and an orthographic projection of the second branch is located on a side of the orthographic projection of the second main branch facing away from the first gate line; the second bridging electrode is electrically connected to the second detection electrode through the third-type via holes respectively at two ends of the second main branch, and electrically connected to the transition electrode through the fourth-type via hole at an end of the second branch.

In a possible embodiment, the pixel electrode includes first-type pixel electrodes adjacent to the second bridging electrode, and second-type pixel electrodes other than the first-type pixel electrodes, where an area of the first-type pixel electrodes is smaller than an area of the second-type pixel electrodes.

In a possible embodiment, the transistor includes an active layer located between the base substrate and the gate layer; there is a gap between an orthographic projection of the active layer on the base substrate and the orthographic projection of the photosensitive detection component on the base substrate.

In a possible embodiment, the transistor further includes a light shielding layer located between the base substrate and the active layer; an orthographic projection of the light shielding layer on the base substrate covers the orthographic projection of the active layer on the base substrate, and the orthographic projection of the light shielding layer on the base substrate and the orthographic projection of the photosensitive detection component on the base substrate do not overlap with each other.

In a possible embodiment, the display panel further includes a data line located in a same layer as the light shielding layer.

In a possible embodiment, the gate layer further includes a second gate line extending in the first direction and providing a pixel scan signal to the light-emitting device.

In a possible embodiment, the orthographic projection of the photosensitive detection component on the base substrate is a rectangle.

An embodiment of the disclosure further provides a display device including the display panel as provided in embodiments of the disclosure.

In a possible embodiment, the display device further includes: a display control chip and a detection control chip; where the display control chip is electrically connected to the pixel circuit to control light emission of the light-emitting device; and the detection control chip is electrically connected to the detection circuit to control detection of the photosensitive detection component.

DETAILED DESCRIPTION OF EMBODIMENTS

Figure 1:
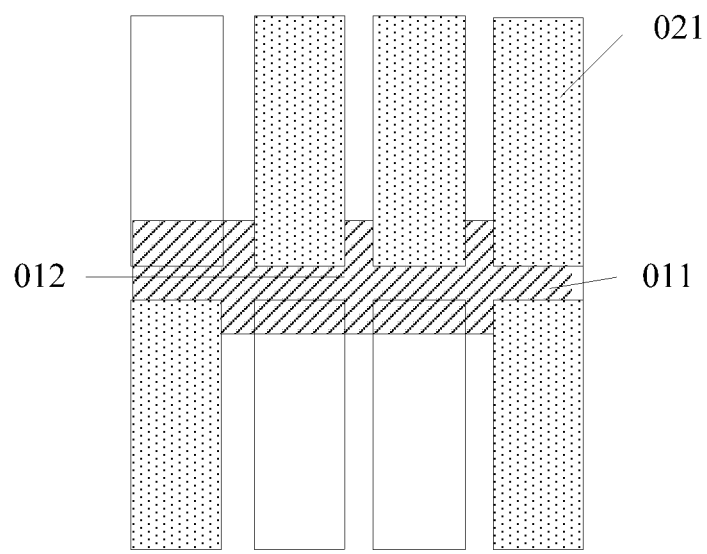
FIG. 1 is a structural schematic diagram of a display panel provided in the related technology.

As shown in FIG. 1, in the related technology, in order to ensure higher compensation accuracy and signal-to-noise ratio for a light-emitting device 021, a photosensitive detection component 011 and a transistor 012 that drives the photosensitive detection component 011 need to occupy a certain layout area, resulting in a reduction in the aperture ratio. Thus, in order to cope with the high resolution (PPI) design, it is necessary to use a design of sharing the photosensitive detection component 011. For an optical compensation circuit with high PPI, there is currently a design method in which several (eight in FIG. 1) light-emitting devices 021 share a photosensitive detection component 011 (sensor), and the transistor 012 (TFT) controlling the photosensitive detection component 011 and the gate control line thereof are placed under the photosensitive detection component 011. This solution causes the quite unevenness under the photosensitive detection component 011 due to excessive crossover lines. In order to ensure the low dark current of the photosensitive detection component 011, there is a need to add a plurality of film layers under the photosensitive detection component 011 and perform the masking process many times (for example, fabricate a planarization layer, an edge UV exposure layer, etc.). However, this area has a higher segment gap after a plurality of film layers are added, so that the subsequently fabricated film layer (such as an organic emitting layer) has a risk of line breakage at the edge of the photosensitive detection component 011.

In order to make the purposes, technical solutions and advantages of the disclosure clearer, technical solutions of embodiments of the disclosure will be described clearly and completely below in combination with the accompanying drawings of embodiments of the disclosure. Obviously the described embodiments are a part of embodiments of the disclosure but not all embodiments. Based upon embodiments of the disclosure, all of other embodiments obtained by those ordinary skilled in the art without creative work pertain to the protection scope of the disclosure.

Unless otherwise defined, the technical or scientific terms used in the disclosure shall have the general meaning understood by those ordinary skilled in the art to which the disclosure belongs. The "first", "second" and similar words used in the disclosure do not represent any order, number or importance, and are only used to distinguish different components. The word such as "include" or "contain" or the like means that the element or object appearing before this word encompasses the elements or objects and their equivalents listed after this word, without excluding other elements or objects. The word such as "connect" or "connected" or the like is not limited to the physical or mechanical connection, but can include the electrical connection, whether direct or indirect. The words such as "up", "down", "left", "right" are only used to represent the relative position relationship. When the absolute position of a described object changes, the relative position relationship may also change accordingly.

In order to keep the following description of embodiments of the disclosure clear and concise, the disclosure omits the detailed description of known functions and known components.

Figure 2:
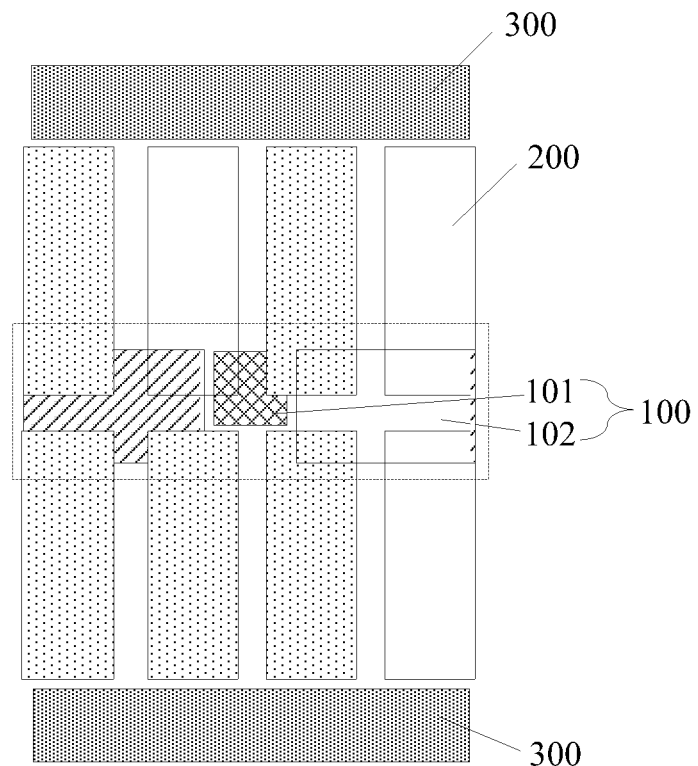
FIG. 2 is a structural schematic diagram of a partial top view of a display panel according to an embodiment of the disclosure.
Figure 3:
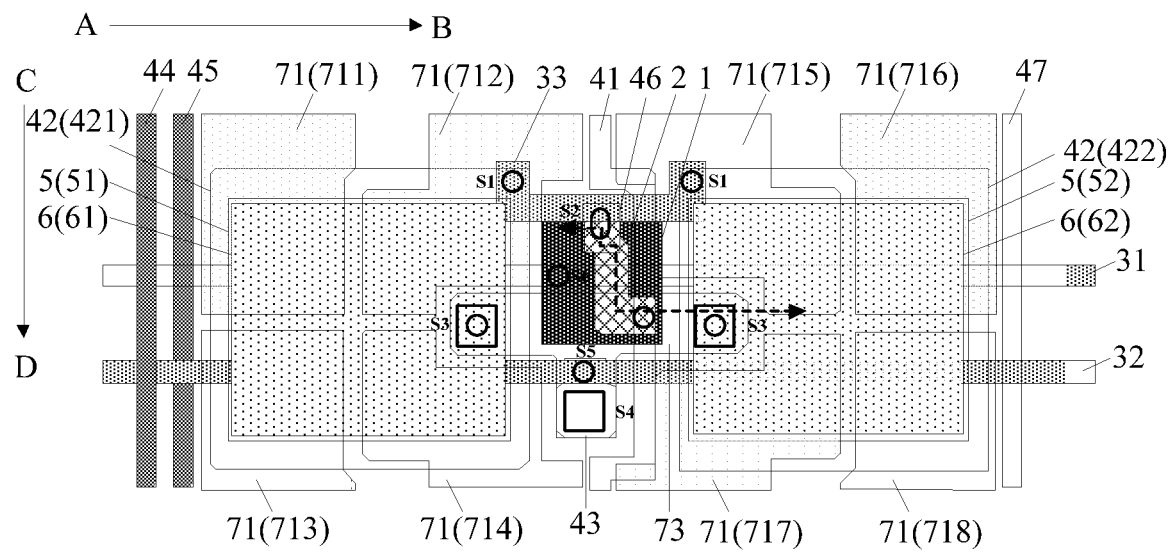
FIG. 3 is a schematic diagram of an enlarged structure at the dotted box in FIG. 2.
Figure 4:
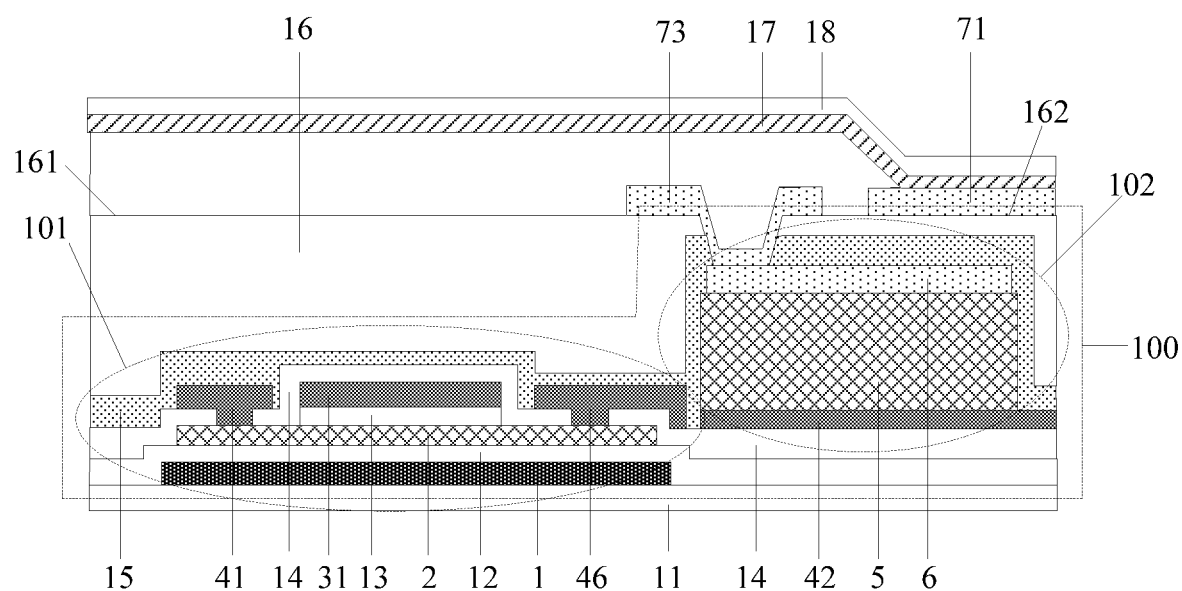
FIG. 4 is a schematic diagram of a cross-sectional structure of FIG. 3 at the dotted line.

As shown in FIGS. 2, 3 and 4, FIG. 3 is a schematic diagram of an enlarged structure of FIG. 2 at the dotted box, and FIG. 4 is a schematic diagram of a cross-sectional structure of FIG. 3 along the dashed line with a double arrow. An embodiment of the disclosure provides a display panel, including: a base substrate 11; a detection circuit 100, located on a side of the base substrate 11, and including a transistor 101 and a photosensitive detection component 102 electrically connected to the transistor 101, where an orthographic projection of the transistor 101 on the base substrate 11 and an orthographic projection of the photosensitive detection component 102 on the base substrate 11 do not overlap with each other; a planarization layer 16, located on a side of the detection circuit 100 facing away from the base substrate 11, and including: a first surface 161 facing away from the base substrate at a position where the transistor 101 is located, and a second surface 162 facing away from the base substrate 11 at a position where the photosensitive detection component 102 is located, where the first surface 161 and the second surface 162 are located on a same plane; a light-emitting device 200, located on a side of the planarization layer 16 facing away from the detection circuit 100; a pixel circuit 300, electrically connected to the light-emitting device 200, where an orthographic projection of the pixel circuit 300 on the base substrate 11, an orthographic projection of the light-emitting device 200 on the base substrate 11, and an orthographic projection of the detection circuit 100 on the base substrate 11 do not overlap with each other. That is, as shown in FIG. 2, the pixel circuit 300 and the detection circuit 100 of a same row of light-emitting devices 200 are respectively located on different sides of the light-emitting devices 200, for example, the pixel circuit 300 is located on the upper side of the light-emitting devices 200, and the detection circuit 100 is located on the lower side of the light-emitting devices 200. That is, the display panel provided in embodiments of the disclosure may be a bottom emission display panel, where the light emitted by the light-emitting device 200 emits downward through the base substrate 11, while the projections of the pixel circuit 300, the detection circuit 100 and the light-emitting device 200 do not overlap with each other, thereby preventing the light emitted by the light-emitting device 200 from being blocked by the pixel circuit 300 and the detection circuit 100 when the pixel circuit 300 and the detection circuit 100 are located directly below the light-emitting device 200.

In an embodiment of the disclosure, the display panel includes: the transistor 101 and the photosensitive detection component 102 electrically connected to the transistor 101, where the orthographic projection of the transistor 101 on the base substrate 11 and the orthographic projection of the photosensitive detection component 102 on the base substrate 11 do not overlap with each other; and the planarization layer 16, located on the side of the detection circuit 100 facing away from the base substrate 11, and including the first surface 161 facing away from the base substrate at the position where the transistor 101 is located, and the second surface 162 facing away from the base substrate 11 at the position where the photosensitive detection component 102 is located, where the first surface 161 and the second surface 162 are located on the same plane. That is, in an embodiment of the disclosure, by misaligning the photosensitive detection component 102 with the transistor 101 that drives the photosensitive detection component 102, there is no transistor 101 under the photosensitive detection component 102, the flatness is high, and the dark current of the photosensitive detection component 102 is low, so that the planarization layer 16 is located on the same plane at the position of the photosensitive detection component 102 and at the position of the transistor 101. Then, when the subsequent film layers are fabricated, the large segment gap of the display panel at the edge of the photosensitive detection component 102 can be improved, reducing the risk of line breakage easily generated when the subsequent film layer (such as an organic light-emitting layer 17 of the light-emitting device 200) climbs a slope at the edge of the photosensitive detection component 102. Also, compared with the related art, an embodiment of the disclosure omits a plurality of planarization layers that need to be disposed under the photosensitive detection component 102 and saves the number of masks. In addition, the first surface 161 and the second surface 162 are located on the same plane, and may form a relatively flat surface. When the light-emitting device is subsequently formed, the light-emitting layer may be relatively flat, so that the display panel has a better light-emitting effect.

In an embodiment, at least two light-emitting devices 200 share one photosensitive detection component 102, and each of the light-emitting devices 200 sharing the same photosensitive detection component 102 has an overlapping area with the photosensitive detection component 102; and at least two photosensitive detection components 102 are electrically connected to a same transistor 101. With reference to FIGS. 2 to 4, every four light-emitting devices 200 may share one photosensitive detection component 102, the four light-emitting devices 200 are located in two adjacent rows and two adjacent columns, and the photosensitive detection component 102 is located at a center of a quadrangle formed by centers of the four light-emitting devices 200; every two photosensitive detection components 102 are connected to one transistor 101, and the transistor 101 is located between two adjacent photosensitive detection components 102 between two adjacent rows of light-emitting devices 200.

In an embodiment of the disclosure, every four light-emitting devices 200 share one photosensitive detection component 102, and every two photosensitive detection components 102 are connected to one transistor 101. Compared with the case that each light-emitting device 200 is provided with one photosensitive detection component 102 and one transistor 101, an embodiment of the disclosure can save the space occupied by the photosensitive detection components 102 and the transistors 101, facilitating the display panel to achieve the high pixel resolution.

Figure 5:
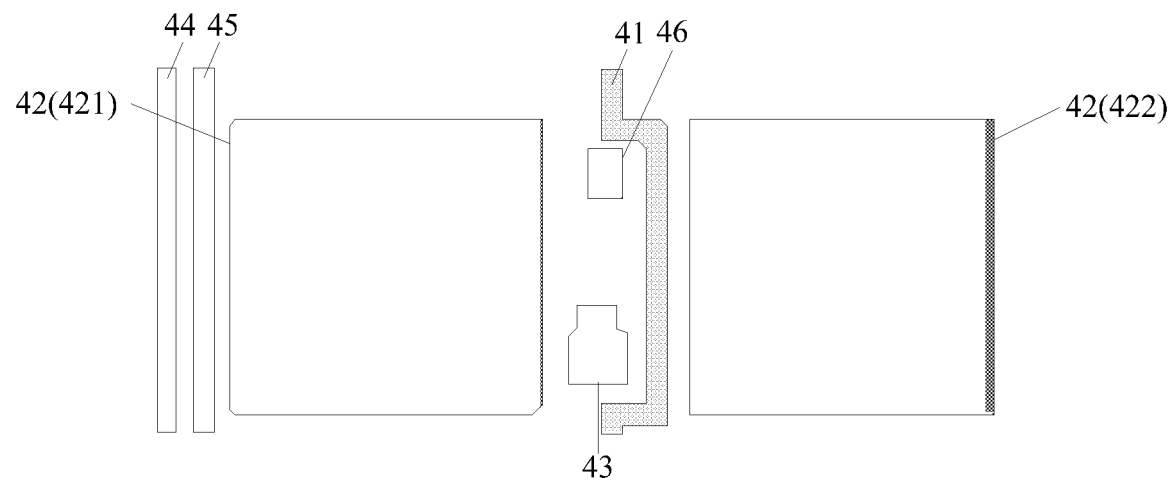
FIG. 5 is a structural schematic diagram of a top view of a source and drain layer according to an embodiment of the disclosure.
Figure 6:
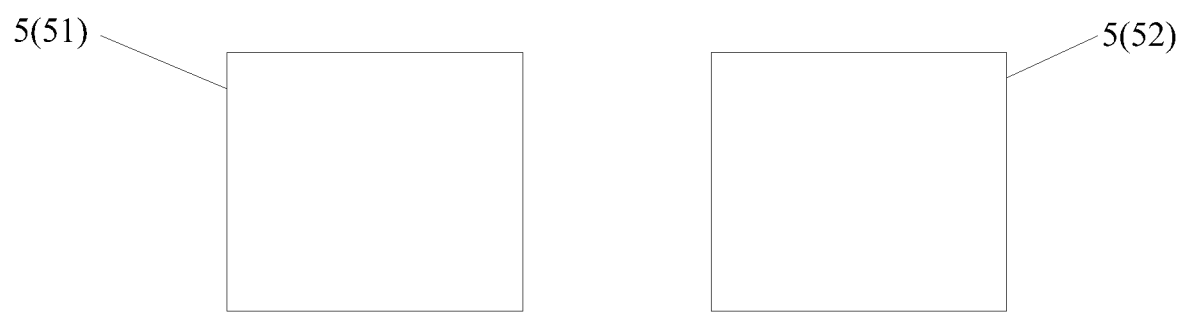
FIG. 6 is a structural schematic diagram of a top view of a photosensitive layer according to an embodiment of the disclosure.
Figure 7:
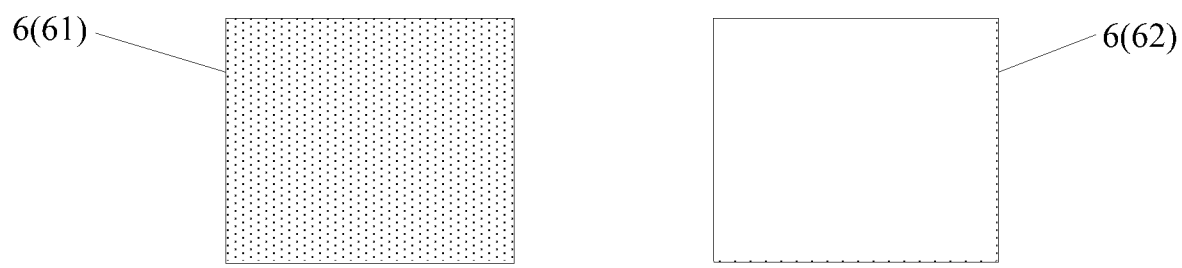
FIG. 7 is a structural schematic diagram of a top view of a second detection electrode layer according to an embodiment of the disclosure.

In an embodiment, referring to FIGS. 3 to 7, FIG. 5 is the pattern of the source and drain layer in FIG. 3, FIG. 6 is the pattern of the photosensitive film layer in FIG. 3, and FIG. 7 is the pattern of the second detection electrode in FIG. 3. The photosensitive detection component 102 includes: a first detection electrode 42, a photosensitive film layer 5 located on a side of the first detection electrode 42 facing away from the base substrate 11, and a second detection electrode 6 located on a side of the photosensitive film layer 5 facing away from the first detection electrode 42; the transistor 101 includes a source and drain layer located on a side of the base substrate 11, and the first detection electrode 42 is located in the source and drain layer. The source and drain layer may further include a source electrode 46. In an embodiment of the disclosure, the first detection electrode 42 of the photosensitive detection component 102 is disposed in the same layer as the source and drain layer, which can reduce the number of mask processes required to manufacture the photosensitive detection component 102 while improving the segment gap problem.

Figure 8:
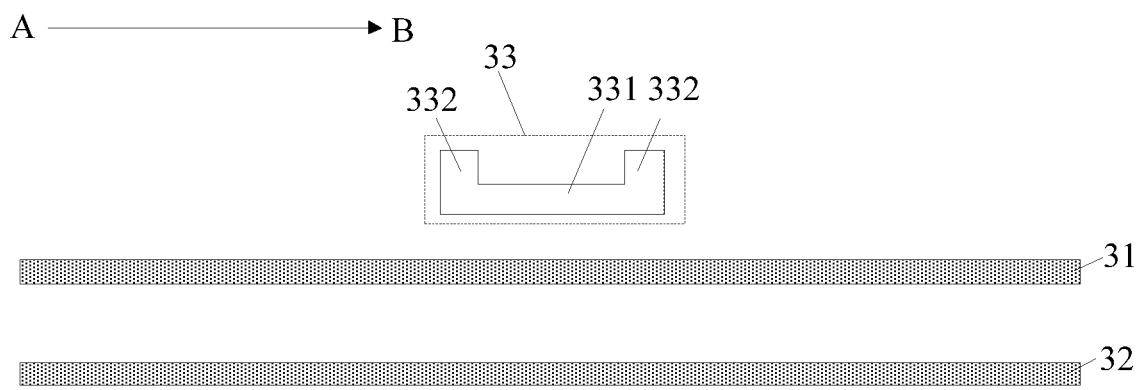
FIG. 8 is a structural schematic diagram of a top view of a gate layer according to an embodiment of the disclosure.

In an embodiment, referring to FIGS. 3, 4 and 8, FIG. 8 is the pattern of a gate layer. The transistor 101 includes: a gate layer located between the base substrate 11 and the source and drain layer, and an interlayer dielectric layer 14 located between the gate layer and the source and drain layer; the gate layer includes: a first gate line 31 located between two adjacent rows of light-emitting devices 200 and extending in a first direction AB, and a first bridging electrode 33 located between two adjacent rows of light-emitting devices 200, where an orthographic projection of the first bridging electrode 33 on the base substrate 11 has an overlap area with each of first detection electrodes 42 of the two photosensitive detection components 102 sharing the same transistor 101 (that is, the orthographic projection of the first bridging electrode 33 on the base substrate 11 has an overlap area with each of the first detection electrode 421 on the left and the first detection electrode 422 on the right); the two first detection electrodes 42 are electrically connected to the same first bridging electrode 33 through first-type via holes S1 penetrating the interlayer dielectric layer 14, and electrically connected to a source electrode 46 in the source and drain layer of the transistor 101 through a second-type via hole S2 penetrating the interlayer dielectric layer 14 through the first bridging electrode 33. That is, the first detection electrodes 42 of the photosensitive detection components 102 located in the source and drain layer is firstly electrically connected downward to the first bridging electrode 33 of the gate layer through the first-type via holes S1, and then the first bridging electrode 33 of the gate layer is electrically connected upward to the source electrode 46 of the source and drain layer through the second-type via hole S2, so that the first detection electrodes 42 of the two photosensitive detection components 102 are electrically connected to the source electrodes 46 of the same transistor 101 without affecting other signal wiring of the source and drain layer.

In an embodiment of the disclosure, by arranging the first bridging electrode 33 in the gate layer, the second detection electrodes 6 (i.e., lower electrodes) of two photosensitive detection components 102 are connected to the source electrode 46 of the same transistor 101 through the first bridging electrode 33, and thus two photosensitive detection components 102 are driven through one transistor 101.

In an embodiment, as shown in FIG. 3 and FIG. 5, the source and drain layer further includes: a first light detection signal line 41 located between two adjacent photosensitive detection components 102 and extending perpendicular to the first direction AB (perpendicular to the first direction AB, that is, in the second direction CD), where the first light detection signal line 41 is multiplexed as a drain electrode of the transistor. The source electrode 46 of the transistor may be electrically connected to one end of an active layer 2 through a via hole penetrating the interlayer dielectric layer 14, and the first light detection signal line 41 may be electrically connected to the other end of the active layer 2 through a via hole penetrating the interlayer dielectric layer 14.

In an embodiment of the disclosure, the source and drain layer further includes the first light detection signal line 41 that is multiplexed as the drain electrode of the transistor. Since the first detection electrode 42 of the light detection component 101 has been electrically connected to the source electrode 46 of the transistor, the first detection electrode 42 of the photosensitive detection component 102 is electrically connected to the first light detection signal line 41 through the transistor 101. When the photosensitive detection component 102 is used for detection and after the photosensitive detection component 102 detects changed photocurrent signal, the photocurrent signal may be transmitted to the source electrode 46 of the transistor 101 through the first detection electrode 42 and transmitted to the first light detection signal line 41 multiplexed as the drain electrode of the transistor 101 through the conduction of the transistor 101, and then the detected photocurrent signal is transmitted out.

In an embodiment, referring to FIG. 8, the first bridging electrode 33 includes: a first main branch 331 extending in the first direction AB, and two first branches 332 that are connected to two ends of the first main branch 331 respectively and extend perpendicular to the first direction AB and towards a side facing away from the first gate line 31; the first bridging electrode 33 is electrically connected to the first detection electrode 42 through the first-type via holes S1 at the first branches 332, and electrically connected to the source electrode 46 through the second-type via hole S2 at middle of the first main branch 331. In an embodiment of the disclosure, the first bridging electrode 33 includes the first main branch 331 and two first branches 332 connected to the first main branch 331, and the first branches 332 extend toward the side facing away from the first gate line 31, so that the intersection of the first branches 332 with the first gate line 31 in the same layer can be avoided.

In an embodiment, referring to FIG. 8, the gate layer further includes: a second light detection signal line 32 having a same extension direction as the first gate line 31 and located on a side of the first gate line 31 facing away from the first bridging electrode 33. The second light detection signal line 32 may be a signal line that provides a signal to the second detection electrode 6 of the photosensitive detection component 102.

In an embodiment, referring to FIGS. 3, 4, 5 and 9, the source and drain layer further includes: a transition electrode 43; the light-emitting device includes: a pixel electrode layer, the pixel electrode layer includes: a pixel electrode 71 and a second bridging electrode 73; the display panel further includes: a passivation layer 15 located between the second detection electrode 6 and the planarization layer 16, where the passivation layer 15 contacts and covers the source and drain layer of the transistor 101, and contacts and covers the second detection electrode 6 of the photosensitive detection component 102; an orthographic projection of the second bridging electrode 73 on the base substrate 11 has an overlap area with each of second detection electrodes 6 of the two photosensitive detection components 102 sharing the same transistor 101; and the two second detection electrodes 6 (i.e., the second detection electrode 61 of the left photosensitive detection component, and the second detection electrode 62 of the right photosensitive detection component) are electrically connected to the same second bridging electrode 73 through third-type via holes S3 penetrating the planarization layer 16 and the passivation layer 15, electrically connected to the transition electrode 43 through a fourth-type via hole S4 penetrating the planarization layer 16 and the passivation layer 15 through the second bridging electrode 73, and electrically connected to the second light detection signal line 32 through a fifth-type via hole S5 penetrating the interlayer dielectric layer 14 through the transition electrode 43. The third-type via holes S3 may be sleeve holes.

In an embodiment of the disclosure, the pixel electrode layer is further provided with the second bridging electrode 73, and the source and drain layer is further provided with the transition electrode 43. Thus, when the second detection electrodes 6 of the photosensitive detection components 102 are electrically connected to the second light detection signal line 32, the second detection electrodes 6 of two photosensitive detection components 102 may be electrically connected upward to the second bridging electrode 73 of the pixel electrode layer at first, then the second bridging electrode 73 is electrically connected downward to the transition electrode 43 of the source and drain layer, then the transition electrode 43 of the source and drain layer is electrically connected downward to the second detection signal line 32 of the gate layer, and thus finally the second detection electrodes 6 of the photosensitive detection components 102 are electrically connected to the second detection signal line 32, to provide electrical signals to the second detection electrodes 6 of the photosensitive detection components 102 through the second light detection signal line 32.

Figure 9:
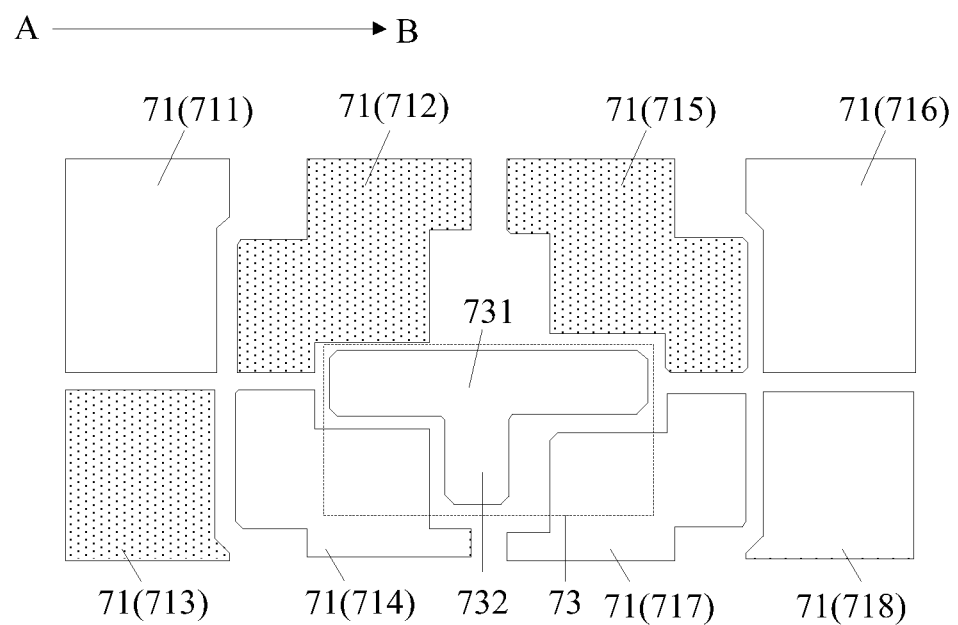
FIG. 9 is a structural schematic diagram of a top view of a pixel electrode layer according to an embodiment of the disclosure.

In an embodiment, referring to FIG. 3 and FIG. 9, the second bridging electrode 73 includes a second main branch 731 extending in the first direction AB and a second branch 732 extending perpendicular to the first direction AB from a middle portion of the second main branch 731, where: in a direction perpendicular to the base substrate 11, an orthographic projection of the second main branch 731 is located between an orthographic projection of the first gate line 31 and an orthographic projection of the second light detection signal line 32, and an orthographic projection of the second branch 732 is located on a side of the orthographic projection of the second main branch 731 facing away from the first gate line 31 (i.e., extending downward as in FIG. 3); the second bridging electrode 73 is electrically connected to the second detection electrodes 6 through the third-type via holes S3 respectively at two ends of the second main branch 731, and electrically connected to the transition electrode 43 through the fourth-type via hole S4 at an end of the second branch 732.

In an embodiment of the disclosure, the second bridging electrode 73 includes the second main branch 731 and the second branch 732 extending from the middle portion of the second main branch 731, where the orthographic projection of the second branch 732 is located on the side of the orthographic projection of the second main branch 731 facing away from the first gate line 31, to form an overlapping area with the transition electrode 43 and thus achieve the electrical connection with the transition electrode 43 by punching holes.

As shown in FIG. 5, the transition electrode 43 may be a strip extending perpendicular to the first direction AB, and an orthographic projection of the transition electrode 43 on the base substrate 11 overlaps with the orthographic projection of the second branch 732 and also overlaps with the orthographic projection of the second light detection signal line 32, to realize the electrical connections with the second branch 732 and the second light detection signal line 32 by punching holes.

As shown in FIG. 9, the pixel electrode 71 includes first-type pixel electrodes (e.g., a pixel electrode 712 on the upper left side of the second bridging electrode 73, a pixel electrode 715 on the upper right side of the second bridging electrode 73, a pixel electrode 714 on the lower left side of the second bridging electrode 73, and a pixel electrode 717 on the lower right side of the second bridging electrode 73 in FIG. 9) adjacent to the second bridging electrode 73, and second-type pixel electrodes (e.g., a pixel electrode 711, a pixel electrode 716, a pixel electrode 713 and a pixel electrode 718 in FIG. 9) other than the first-type pixel electrodes, where an area of the first-type pixel electrodes is smaller than an area of the second-type pixel electrodes. That is, the first-type pixel electrodes may be removed at the portion opposite to the second bridging electrode 73 to avoid the second bridging electrode 73 arranged at this position in the same layer. The area of the first-type pixel electrodes may be 80% to 90% of the area of the second-type pixel electrodes.

Figure 10:
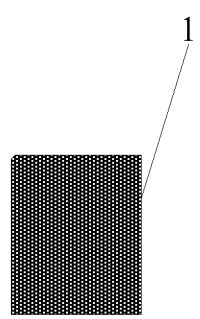
FIG. 10 is a structural schematic diagram of a top view of an active layer according to an embodiment of the disclosure.

In an embodiment, referring to FIG. 3 and FIG. 10, the transistor includes an active layer 2 located between the base substrate 11 and the gate layer; and there is a gap between an orthographic projection of the active layer 2 on the base substrate 11 and the orthographic projection of the photosensitive detection component 102 on the base substrate 11.

In an embodiment of the disclosure, there is a gap between the orthographic projection of the active layer 2 on the base substrate 11 and the orthographic projection of the photosensitive detection component 102 on the base substrate 11, that is, there is no overlap between them, which can avoid the problem that the display panel is prone to have a large segment gap of film layers at the boundary of the photosensitive detection component 102 due to many film layers under the photosensitive detection component 102 when the active layer 2 is disposed directly under the photosensitive detection component 102.

Figure 11:
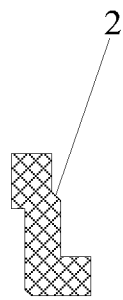
FIG. 11 is a structural schematic diagram of a top view of a light shielding layer according to an embodiment of the disclosure.

In an embodiment, referring to FIG. 3 and FIG. 11, the transistor 101 further includes a light shielding layer 1 located between the base substrate 11 and the active layer; an orthographic projection of the light shielding layer 1 on the base substrate 11 covers the orthographic projection of the active layer 2 on the base substrate 11, and the orthographic projection of the light shielding layer 1 on the base substrate 11 and the orthographic projection of the photosensitive detection component 102 on the base substrate 11 do not overlap with each other.

In an embodiment of the disclosure, the orthographic projection of the light shielding layer 1 on the base substrate 11 covers the orthographic projection of the active layer 2 on the base substrate 11, which can prevent the active layer 2 from being irradiated by the external light to avoid the effect on the performance of the transistor 101. Furthermore, the orthographic projection of the light shielding layer 1 on the base substrate 11 and the orthographic projection of the photosensitive detection component 102 on the base substrate 11 do not overlap with each other, which can avoid the problem that the display panel is prone to have a large segment gap of film layers at the boundary of the photosensitive detection component 102 due to many film layers under the photosensitive detection component 102 when the light shielding layer 1 is disposed directly under the photosensitive detection component 102.

In an embodiment, as shown in FIG. 4, a buffer layer 12 is further arranged between the light shielding layer 1 and the active layer 2, and a gate insulating layer 13 is further arranged between the active layer 2 and the gate layer; the light-emitting device further includes an organic light-emitting layer 17 located on the side of the pixel electrode 71 facing away from the base substrate 11, and a cathode layer 18 located on the side of the organic light-emitting layer 17 facing away from the pixel electrode 71.

In an embodiment, as shown in FIG. 3, the light shielding layer 1 may also be electrically connected to the first gate line 31 (i.e., gate) through a sixth via hole S6 penetrating the gate insulating layer 13 and the buffer layer 12. After connecting to the gate, a dual gate structure is formed. It is also possible to enable the transistor 101 to be turned off better and reduce the leakage current.

Figure 12:
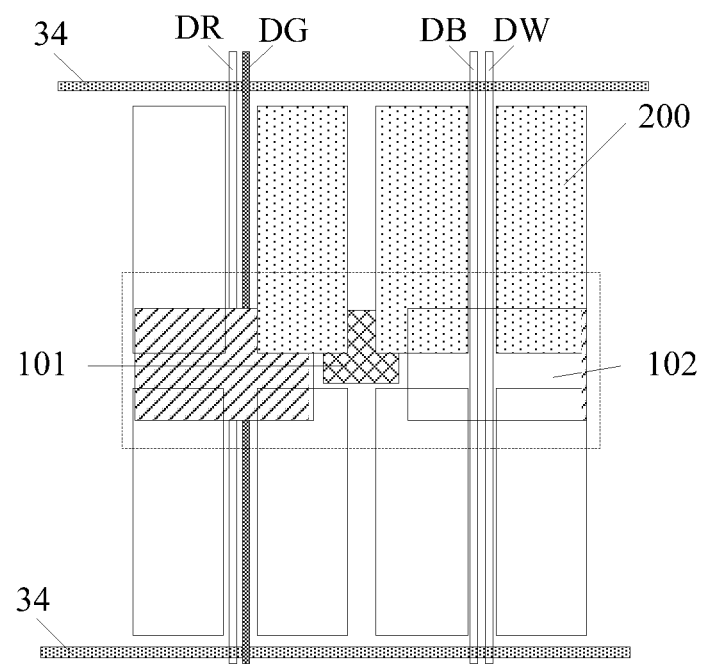
FIG. 12 is a structural schematic diagram of a top view of a portion of the display panel including a second gate line according to an embodiment of the disclosure.

In an embodiment, as shown in FIG. 12, the display panel further includes data lines located in a same layer as the light shielding layer 1. The data lines may include first-type data lines DR that provide data signals to red light-emitting devices that emit red light, second-type data lines DG that provide data signals to green light-emitting devices that emit green light, third-type data lines DB that provide data signals to blue light-emitting devices that emit blue light, and fourth-type data lines DW that provide data signals to white light-emitting devices that emit white light. The material of the light shielding layer 1 may be metal, and the light shielding layer 1 and the data lines may be realized by a single mask process.

In an embodiment of the disclosure, since the first detection electrode 42 of the photosensitive detection component 102 is located in the source and drain layer and occupies a large area, the data lines are arranged in the light shielding layer 1, instead of the traditional arrangement of the data lines in the source and drain layer, embodiments of the disclosure may enable the data lines to avoid the first detection electrode 42 of the photosensitive detection component 102.

In an embodiment, as shown in FIG. 12, the gate layer further includes a second gate line 34 extending in the first direction AB and providing a pixel scan signal to the light-emitting device, that is, the display panel further includes the second gate line 34 that may be used to provide a gate signal to the gate of the transistor of the pixel circuit, and the second gate line 34 may be arranged in the same layer as the first gate line 31.

In an embodiment of the disclosure, the second gate line 34 that provides the pixel scan signal to the light-emitting device 200 is located in the gate layer, and the second gate line 34 may be formed at the same time as the gate layer of the transistor that drives the photosensitive detection component 102, thereby reducing the number of masking processes of the display panel.

In an embodiment, as shown in FIG. 3, the orthographic projection of the photosensitive detection component 102 on the base substrate 11 is a rectangle.

In an embodiment of the disclosure, the orthographic projection of the photosensitive detection component 102 on the base substrate 11 is a rectangle. Compared with the projections being pentagon, hexagon and polygon with more vertices, the photosensitive detection component 102 may have a lower dark current without light irradiation, thereby improving the detection sensitivity of the photosensitive detection component 102.

In an embodiment, as shown in FIG. 3 and FIG. 5, the source and drain layer may further include a first power supply line (VDD) 44 and an electrical detection signal line (Senso_EL) 45, that is, the first power line (VDD) 44, the electrical detection signal line (Senso_EL) 45 and a first light detection signal line (Sense_OP) 41 in the longitudinal direction (the second direction CD) use the source and drain layer for wiring; and the first gate line 31, the second gate line 34 and the second light detection signal line 32 in the horizontal direction (the first direction AB) use the gate layer for wiring, where the data lines (DR/DG/DB/DW) use the light shielding layer for wiring under the photosensitive detection component 102 and use the source and drain layer for wiring at other positions (since there is a whole piece of metal under the photosensitive detection component 102 as the first detection electrode 42 thereof, the wiring of the data lines moves to another layer here).

In an embodiment, the pixel circuit 300 controls the light emission of the light-emitting device 200 mainly through a switch transistor (Switch TFT) and a drive transistor (Drive TFT), where the gates of the switch transistor (Switch TFT) and the drive transistor (Drive TFT) may both be the second gate line 34, that is, one gate design can save the layout space. The pixel circuit 300 may further be provided with a sensing transistor (Sense TFT), where the design of the sensing transistor (Sense TFT) retains the function of electrical compensation, that is, the electrical compensation may be realized through the sensing transistor (Sense TFT), and the optical compensation may also be realized through the photosensitive detection component 102.

Based on the same inventive concept, an embodiment of the disclosure further provides a display device, including the display panel provided in embodiments of the disclosure.

In an embodiment, the display device further includes: a display control chip and a detection control chip; where the display control chip is electrically connected to the pixel circuit to control the light emission of the light-emitting device; and the detection control chip is electrically connected to the detection circuit to control the detection of the photosensitive detection component. The display control chip may include: a gate drive chip and a source drive chip. The overall distribution of the display device may be as follows: the gate drive chip (Gate IC) is arranged on the left side of the display panel to control the signals of the first gate line 31 and the second gate line 34, and the source drive chip (Source IC) is arranged on the lower edge of the display panel to control the signal inputs of the first power line (VDD) 44, the first-type data lines DR, the second-type data lines DG, the third-type data lines DB and the fourth-type data lines DW. That is, the pixel circuit provide signals to the second gate line 34 through the gate drive chip (Gate IC) and provide signals to the first power supply line (VDD) 44, the first-type data lines DR, the second-type data lines DG, the third-type data lines DB and the fourth-type data lines DW through the source drive chip (Source IC), to realize the switching of each light-emitting device and the display of different brightness; and the photosensitive detection component 102 provides signals to the second light detection signal line 32 through a detection control chip (Sensor IC) on the upper edge of the display panel and provides signals to the first gate line 31 through the gate drive chip (Gate IC) to control the detection of the photosensitive detection component 102. The photocurrent data detected by the photosensitive detection component 102 is transmitted to the detection control chip (Sensor IC) through the first light detection signal line 41; and the detection control chip (Sensor IC) obtains detection data of each light-emitting device 200 and transmits the detection data to a logic circuit board (Tcon). After the data is processed, the difference in the sensed value is converted into the difference in the data line value input by the source drive chip (Source IC), thereby realizing the optical compensation for the display of each light-emitting device 200.

The beneficial effects of an embodiment of the disclosure are as follows: in an embodiment of the disclosure, the display panel includes: the transistor and the photosensitive detection component electrically connected to the transistor, where the orthographic projection of the transistor on the base substrate and the orthographic projection of the photosensitive detection component on the base substrate do not overlap with each other; and the planarization layer, located on a side of the detection circuit facing away from the base substrate, and includes: the first surface facing away from the base substrate at the position where the transistor is located, and the second surface facing away from the base substrate at the position where the photosensitive detection component is located, where the first surface and the second surface are located on the same plane. That is, in an embodiment of the disclosure, the photosensitive detection component is misaligned with the transistor that drives the photosensitive detection component, and the planarization layer is located on the same plane at the position of the photosensitive detection component and at the position of the transistor. Then, when the subsequent film layers are fabricated, the segment gap of the display panel at the junction of the photosensitive detection component and the transistor can be improved, and thus the risk of rupture of the subsequent film layers can be improved. Also, compared with the related art, an embodiment of the disclosure omits a plurality of planarization layers that need to be disposed under the photosensitive detection component and saves the number of masks.

Evidently those skilled in the art can make various modifications and variations to the disclosure without departing from the spirit and scope of the disclosure. Thus the disclosure is also intended to encompass these modifications and variations to the disclosure as long as these modifications and variations come into the scope of the claims of the disclosure and their equivalents.

What is claimed is:

1. A display panel, comprising:
a base substrate;
a detection circuit, located on a side of the base substrate, and comprising a transistor and photosensitive detection components electrically connected to the transistor, wherein an orthographic projection of the transistor on the base substrate and an orthographic projection of each of the photosensitive detection components on the base substrate do not overlap with each other;
a planarization layer, located on a side of the detection circuit facing away from the base substrate, and comprising: a first surface facing away from the base substrate at a position where the transistor is located, and a second surface facing away from the base substrate at a position where each of the photosensitive detection components is located, wherein the first surface and the second surface are located on a same plane;
light-emitting devices, located on a side of the planarization layer facing away from the detection circuit; and
a pixel circuit, electrically connected to the light-emitting devices, wherein an orthographic projection of the pixel circuit on the base substrate, an orthographic projection of each of the light-emitting devices on the base substrate, and an orthographic projection of the detection circuit on the base substrate do not overlap with each other.

2. The display panel of claim 1, wherein at least two of the light-emitting devices share one of the photosensitive detection components, and each of the at least two of the light-emitting devices sharing the same photosensitive detection component has an overlapping area with the photosensitive detection component;
at least two of the photosensitive detection components are electrically connected to the transistor.

3. The display panel of claim 2, wherein every four of the at least two of the light-emitting devices share one of the photosensitive detection components, the four of the at least two of the light-emitting devices are located in two adjacent rows and two adjacent columns, and the one of the photosensitive detection components is located at a center of a quadrangle formed by centers of the four of the at least two of the light-emitting devices.

4. The display panel of claim 3, wherein two of the at least two of the photosensitive detection components are connected to the transistor, and the transistor is located between two adjacent photosensitive detection components between two adjacent rows of the light-emitting devices.

5. The display panel of claim 4, wherein each of the photosensitive detection components comprises: a first detection electrode, a photosensitive film layer located on a side of the first detection electrode facing away from the base substrate, and a second detection electrode located on a side of the photosensitive film layer facing away from the first detection electrode;
the transistor comprises a source and drain layer located on a side of the base substrate, and the first detection electrode is located in the source and drain layer.

6. The display panel of claim 5, wherein the transistor comprises: a gate layer located between the base substrate and the source and drain layer, and an interlayer dielectric layer located between the gate layer and the source and drain layer;
the gate layer comprises: a first gate line located between two adjacent rows of the light-emitting devices and extending in a first direction, and a first bridging electrode located between two adjacent rows of the light-emitting devices, wherein an orthographic projection of the first bridging electrode on the base substrate has an overlap area with each of first detection electrodes of the two of the least two of the photosensitive detection components sharing the same transistor;
two of the first detection electrodes are electrically connected to the same first bridging electrode through first-type via holes penetrating the interlayer dielectric layer, and electrically connected to a source electrode in the source and drain layer of the transistor through a second-type via hole penetrating the interlayer dielectric layer through the first bridging electrode.

7. The display panel of claim 6, wherein the first bridging electrode comprises: a first main branch extending in the first direction, and two first branches that are connected to two ends of the first main branch respectively and extend perpendicular to the first direction and towards a side facing away from the first gate line;
the first bridging electrode is electrically connected to the first detection electrode through the first-type via holes at the first branches, and electrically connected to the source electrode through the second-type via hole at middle of the first main branch.

8. The display panel of claim 7, wherein the source and drain layer further comprises: a first light detection signal line located between two adjacent photosensitive detection components and extending perpendicular to the first direction, wherein the first light detection signal line is multiplexed as a drain electrode of the transistor.

9. The display panel of claim 8, wherein the gate layer further comprises a second gate line extending in the first direction and providing a pixel scan signal to the light-emitting device.

10. The display panel of claim 6, wherein the gate layer further comprises: a second light detection signal line having a same extension direction as the first gate line and located on a side of the first gate line facing away from the first bridging electrode.

11. The display panel of claim 10, wherein the source and drain layer further comprises: a transition electrode; each of the light-emitting devices comprises: a pixel electrode layer, the pixel electrode layer comprising: a pixel electrode and a second bridging electrode; the display panel further comprises: a passivation layer located between the second detection electrode and the planarization layer, wherein the passivation layer contacts and covers the source and drain layer of the transistor, and contacts and covers the second detection electrode of each of the photosensitive detection components;
an orthographic projection of the second bridging electrode on the base substrate has an overlap area with each of second detection electrodes of the two of the at least two of the photosensitive detection components sharing the same transistor; and two of the second detection electrodes are electrically connected to the same second bridging electrode through third-type via holes penetrating the planarization layer and the passivation layer, electrically connected to the transition electrode through a fourth-type via hole penetrating the planarization layer and the passivation layer through the second bridging electrode, and electrically connected to the second light detection signal line through a fifth-type via hole penetrating the interlayer dielectric layer through the transition electrode.

12. The display panel of claim 11, wherein the second bridging electrode comprises a second main branch extending in the first direction and a second branch extending perpendicular to the first direction from a middle portion of the second main branch, wherein: in a direction perpendicular to the base substrate, an orthographic projection of the second main branch is located between an orthographic projection of the first gate line and an orthographic projection of the second light detection signal line, and an orthographic projection of the second branch is located on a side of the orthographic projection of the second main branch facing away from the first gate line;
the second bridging electrode is electrically connected to the second detection electrodes through the third-type via holes respectively at two ends of the second main branch, and electrically connected to the transition electrode through the fourth-type via hole at an end of the second branch.

13. The display panel of claim 11, wherein the pixel electrode comprises first-type pixel electrodes adjacent to the second bridging electrode, and second-type pixel electrodes other than the first-type pixel electrodes, wherein an area of the first-type pixel electrodes is smaller than an area of the second-type pixel electrodes.

14. The display panel of claim 6, wherein the transistor comprises an active layer located between the base substrate and the gate layer;
there is a gap between an orthographic projection of the active layer on the base substrate and the orthographic projection of each of the photosensitive detection components on the base substrate.

15. The display panel of claim 14, wherein the transistor further comprises a light shielding layer located between the base substrate and the active layer;
an orthographic projection of the light shielding layer on the base substrate covers the orthographic projection of the active layer on the base substrate, and the orthographic projection of the light shielding layer on the base substrate and the orthographic projection of each of the photosensitive detection components on the base substrate do not overlap with each other.

16. The display panel of claim 15, wherein the display panel further comprises a data line located in a same layer as the light shielding layer.

17. The display panel of claim 1, wherein the orthographic projection of each of the photosensitive detection components on the base substrate is a rectangle.

18. A display device, comprising a display panel, the display panel comprising:
a base substrate;
a detection circuit, located on a side of the base substrate, and comprising a transistor and photosensitive detection components electrically connected to the transistor, wherein an orthographic projection of the transistor on the base substrate and an orthographic projection of each of the photosensitive detection components on the base substrate do not overlap with each other;
a planarization layer, located on a side of the detection circuit facing away from the base substrate, and comprising: a first surface facing away from the base substrate at a position where the transistor is located, and a second surface facing away from the base substrate at a position where each of the photosensitive detection components is located, wherein the first surface and the second surface are located on a same plane;
light-emitting devices, located on a side of the planarization layer facing away from the detection circuit; and
a pixel circuit, electrically connected to the light-emitting devices, wherein an orthographic projection of the pixel circuit on the base substrate, an orthographic projection of each of the light-emitting devices on the base substrate, and an orthographic projection of the detection circuit on the base substrate do not overlap with each other.

19. The display device of claim 18, wherein the display device further comprises: a display control chip and a detection control chip; wherein the display control chip is electrically connected to the pixel circuit to control light emission of the light-emitting devices; and the detection control chip is electrically connected to the detection circuit to control detection of the photosensitive detection components.

* * * * *